US011105689B2

(12) United States Patent
Polly

(10) Patent No.: US 11,105,689 B2
(45) Date of Patent: Aug. 31, 2021

(54) TEMPERATURE AND HEAT MAP SYSTEM

(71) Applicant: Keithley Instruments, LLC, Solon, OH (US)

(72) Inventor: George J. Polly, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 724 days.

(21) Appl. No.: 15/849,772

(22) Filed: Dec. 21, 2017

(65) Prior Publication Data
US 2018/0259401 A1    Sep. 13, 2018

Related U.S. Application Data

(60) Provisional application No. 62/469,450, filed on Mar. 9, 2017.

(51) Int. Cl.
*G01K 3/14* (2006.01)
*G01R 31/28* (2006.01)
*G01R 31/26* (2020.01)

(52) U.S. Cl.
CPC .......... *G01K 3/14* (2013.01); *G01R 31/2642* (2013.01); *G01R 31/2874* (2013.01)

(58) Field of Classification Search
CPC ...................................................... G01K 3/14
See application file for complete search history.

(56) References Cited

U.S. PATENT DOCUMENTS

| 4,510,576 A | * | 4/1985 | MacArthur | G01L 3/26 374/145 |
| 2005/0258838 A1 | * | 11/2005 | Krishnamoorthy | G01R 31/2877 324/601 |
| 2005/0284470 A1 | * | 12/2005 | Wei | A61M 16/107 128/200.14 |
| 2012/0209559 A1 | * | 8/2012 | Brower | G05B 15/02 702/130 |
| 2013/0121370 A1 | * | 5/2013 | Niebel | H02S 50/10 374/44 |
| 2015/0300882 A1 | * | 10/2015 | Falk | G01J 5/0096 324/754.21 |
| 2016/0342454 A1 | * | 11/2016 | Noel | G06F 11/0709 |

* cited by examiner

*Primary Examiner* — Michael J Dalbo
(74) *Attorney, Agent, or Firm* — Miller Nash Graham & Dunn

(57) ABSTRACT

Embodiments described herein include a data acquisition unit having a plurality of ports that are each configured to receive a signal from a respective temperature sensor of a device under test. Each of the temperature sensors is associated with a location with respect to the device under test. The data acquisition unit also includes a processor configured to determine a temperature corresponding to each temperature sensor, based on the signal received from the respective temperature sensor. The processor can then generate a thermal gradient for the device under test based on the temperature and the location of each of the temperature sensors. This thermal gradient can then be output for further analysis. Additional embodiments may be described and/or claimed herein.

16 Claims, 4 Drawing Sheets

TEMPERATURE AND HEAT MAP SYSTEM

PRIORITY

This disclosure claims benefit of U.S. Provisional Application No. 62/469,450, titled "TEMPERATURE AND HEAT MAP SYSTEM," filed on Mar. 9, 2017, which is incorporated herein by reference in its entirety.

FIELD OF THE INVENTION

This disclosure is directed to systems and methods related to test and measurement systems, and in particular, to thermal monitoring of a device under test and components thereof.

BACKGROUND

Many dataloggers and data acquisition units are used to scan multiple channels, or ports, and measure signals on each of the ports. Oftentimes, dataloggers and data acquisition units are used to gather temperature information of a device under test over a period of time. For example, sometimes ports of the dataloggers and data acquisition units are electrically connected to temperature sensors located on the device under test and during a scan, a temperature associated with each port is determined. The measurements may be saved and used to track temperature fluctuations across a device under test as the device under test is subjected to various conditions. These tests often run over minutes, hours, and sometimes even days or months. Conventionally, the data from each of these tests is transferred to a general-purpose computer to be analyzed using a multiple trace graph. In a trace graph, a trace is generated indicating the temperature measurements, or readings, of each port.

Multiple trace graphs may be difficult for a user to quickly gather information. In addition, multiple trace graphs do not depict temperatures occurring between the various temperature sensors. Certain sophisticated thermal cameras may display thermal gradients, but the accuracy of the measurements for such cameras are limited. In particular, because thermal cameras rely upon measuring infrared light to determine the temperatures, the accuracy of the actual temperature measurements made by such thermal cameras can be particularly prone to error. This is, at least in part, because there are two sources of infrared light, that reflected by an object and that emitted from the object. Between these two sources, the latter reflects the temperature of the object, however, thermal cameras have difficulty discerning between the sources of the light. Further, a thermal camera, while showing live temperature information, does not provide a user with the ability associate the data with particular triggering events. Thermal cameras may also not fit into locations that may be desirable to generate heat maps for the device under test, such as in an oven.

BRIEF DESCRIPTION OF THE DRAWINGS

Aspects, features and advantages of embodiments of the present disclosure will become apparent from the following description of embodiments in reference to the appended drawings in which.

DESCRIPTION

Disclosed herein is a test and measurement instrument, or system, such as a datalogger or a data acquisition unit, that functions as a virtual thermal camera by employing data extracted from temperature readings to generate a thermal gradient. The temperature readings can be captured from a plurality of temperature sensors located on a device under test (DUT), which can result in more accurate temperature measurements than those that can be achieved with thermal cameras. The thermal gradient may be generated using the temperature readings from each of the sensors along with associated locations, with respect to the device under test, of each of the sensors. The thermal gradient can be utilized to generate a heat map of the device under test by overlaying the thermal gradient onto a visual representation of the device under test. The heat map of the device under test can then be output for additional analysis, such as, for example, displaying the heat map of the DUT to a user. The data may be stored over time, and the test and measurement instrument can display the heat map over a time period, which would enable analysis of thermal changes of the DUT over time.

Figure 1:
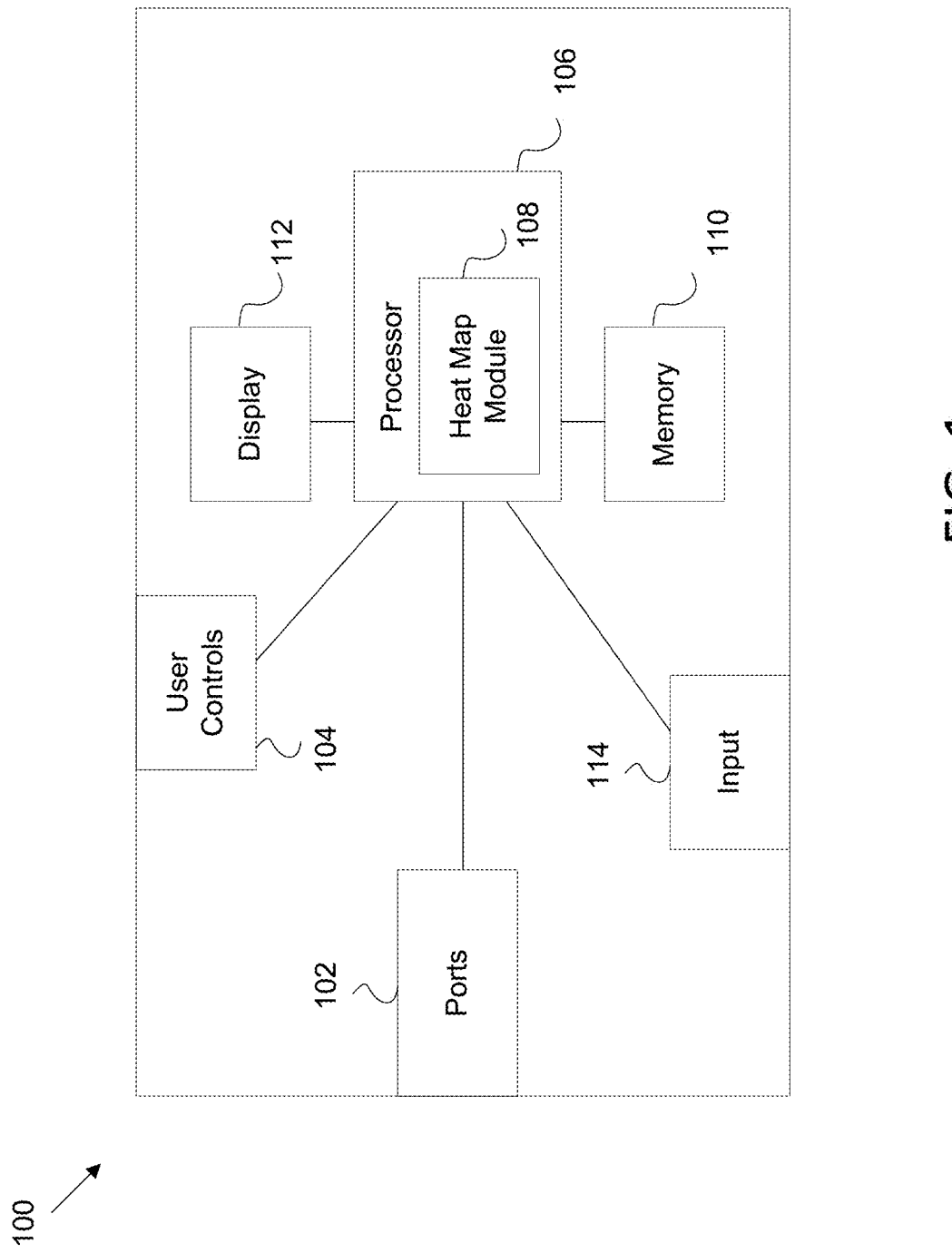
FIG. 1 is a schematic diagram of an example test and measurement instrument according to some embodiments of the disclosure.

FIG. 1 is a schematic diagram of an example test and measurement system 100, such as a datalogger or data acquisition unit, according to embodiments of the disclosure. System 100 includes ports 102 which may be any electrical, optical, and/or wireless ports configured to receive data for scanning and/or for communicating data over a network. Ports 102 may include receivers, transmitters, and/or transceivers. Ports 102 are coupled to a processor 106, which may be implemented, for example, as a processor, an application specific integrated circuit (ASIC), a digital signal processor (DSP), a field programmable gate array (FPGA), etc. Processor 106 is configured to execute instructions from memory 110 and may perform any methods and/or associated steps indicated by the instructions. Processor 106 may include a heat map module 108, which, as discussed in more detail below, may receive temperature data from temperature sensors via ports 102, generate corresponding thermal gradients based on the temperature data and locations associated with each of the sensors, and output the thermal gradients for additional analysis. Such additional analysis can include producing a heat map of the DUT by overlaying the thermal gradients on the visual representation of the DUT. The heat map of the DUT can then be output for display to a user. The heat map module 108 may also implement any process disclosed herein. In some embodiments, the heat map module 108 may be implemented in whole or in part in memory 110 as well. Memory 110 may be implemented as processor cache, random access memory (RAM), read only memory (ROM), solid state memory, hard disk drive(s), or any other memory type. Memory 110 acts as a medium for storing data, computer program products, and other instructions, and providing such data/products/instruction to the processor 106 for computation as needed.

User controls 104 are coupled to the processor 106. User controls 104 may include a keyboard, mouse, trackball, touchscreen, and/or any other controls employable by a user to interact with heat map module 108 via a graphical user interface on a display 112. Display 112 may be a digital screen, a cathode ray tube based display, or any other monitor to display results of heat map module 108, controls, and/or scan values to an end user. While depicted as being integrated with system 100, it will be appreciated that display 112 could also be external to system 100 and could be coupled with system 100 via any wired or wireless technology, or any combination thereof.

System 100 also includes an input 114 that can receive a visual representation of a DUT. The visual representation may be, for example, an image or picture of a DUT, with or without the temperature sensors depicted thereon. Input 114 may include any type of receiver or transceiver to receive the image (e.g., from the user, a camera, a repository, etc.) and may be wireless, wired or any combination thereof. The visual representation of the DUT may include any visual representation of the DUT, such as a photograph or picture of the DUT or any other drawing or rendering of the DUT, including, but not limited to, a CAD drawing, a circuit schematic, or a block diagram. The visual representation of the DUT may be two-dimensional or three-dimensional. In some embodiments, the visual representation of the DUT may be generated on the test and measurement system using the user controls 104 and a graphical user interface.

Figure 2:
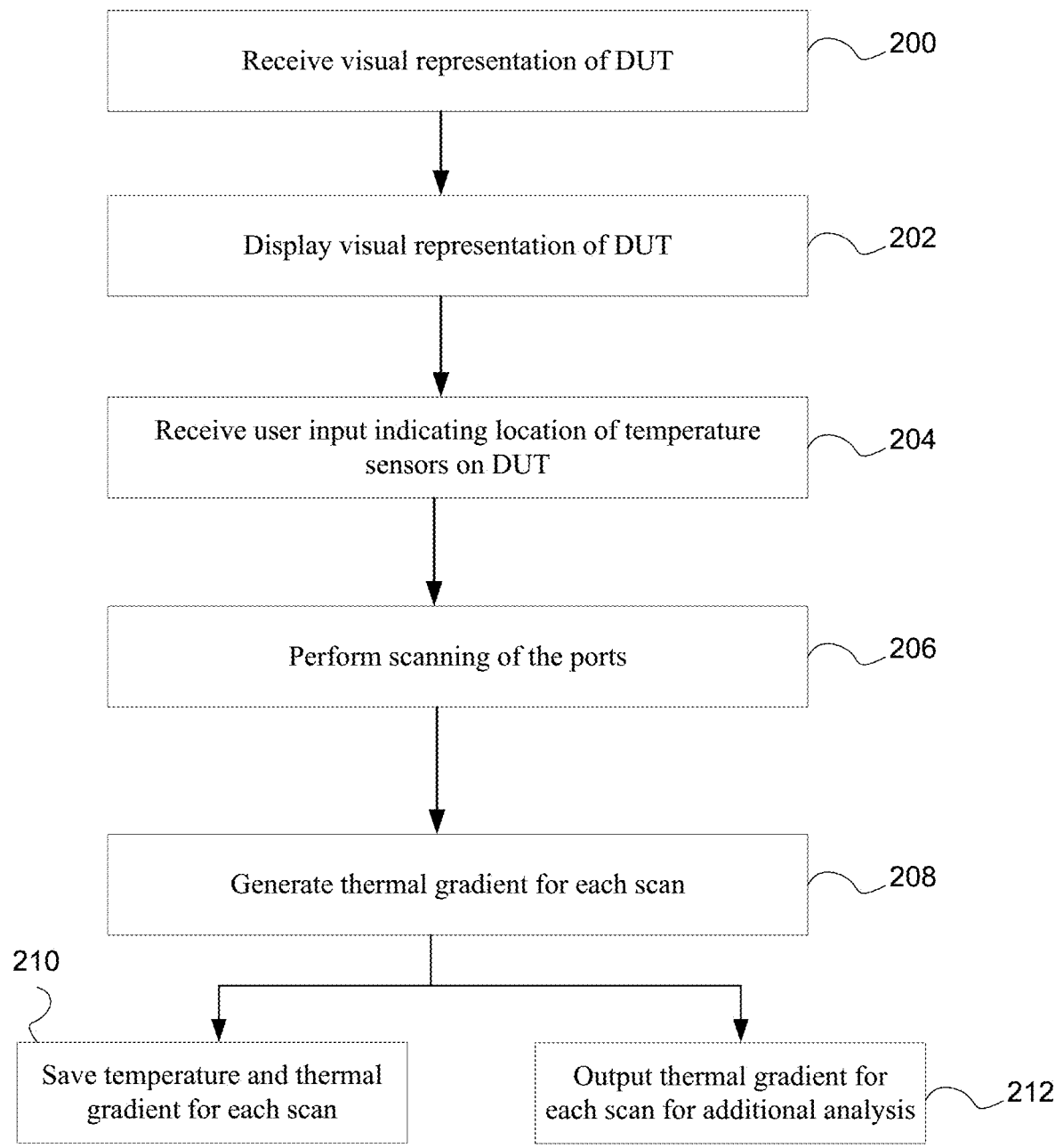
FIG. 2 is a flow chart of an example process for generating and outputting a thermal gradient based on temperatures from a device under test according to some embodiments of the disclosure.

FIG. 2 is a flow chart depicting an illustrative process flow that can be performed, for example, by the heat map module 108 of FIG. 1. As depicted, initially, a visual representation of a DUT may be received at block 200. Such a visual representation may be received, for example, via input 114 (e.g., via a camera, external repository, etc.) or from memory 110 (e.g., via selection of the visual representation from a user via user controls 104). It will be appreciated that such a visual representation of the DUT may not be received in all instances, and as such, this portion of the process flow may be omitted in these instances. In embodiments where a visual representation of the DUT is received, the visual representation can be displayed at block 202 on display 112. A user input may then be received at block 204 indicating locations with respect to the visual representation of the DUT that correspond to temperature sensors located on and/or connected to the DUT. The user may also select which port is connected to each temperature sensor, and the respective location of the temperature sensor can be shown overlaid on the visual representation of the DUT.

It will be appreciated that the above is merely an illustrative method for identifying the location of the temperature sensors with respect to the DUT. Other methods, such as coordinate point locations, automatic detection of the locations of the temperature sensors (e.g., via image based pattern matching), or any other suitable method can be utilized to identify the locations of the temperature sensors with respect to the DUT. These locations can then be associated with the port to which the sensors are connected. This association can be accomplished via user input through user controls 104, by pairing a location associated with the sensor with a corresponding location associated with each port, or through any other suitable mechanism.

Scanning of the ports can then performed at block 206. Scanning includes taking a temperature reading of each temperature sensor connected to each port. This scanning can be a one time scan or multiple scans over a period of time. The period of time could be any increment of time such as hours, days, months, etc. Such a period of time may be set by the user. The test and measurement system 100 switches between each port to take a reading, which is referred to as a single scan. Scanning may be repeated any number of time based on, for example, various time intervals (which may be uniform or may vary) or on one or more triggering events. Such triggering events could be based, for example, on aspects of one or more signals received from the DUT, or any other signal source from which a trigger event can be derived.

For each scan, a thermal gradient can be generated at block 208 based on the temperature readings from each of the temperature sensors and the location of each of the temperature sensors. For example, the thermal gradient can be generated by interpolating temperatures between the location of each of the temperature sensors based on the temperature readings of each of the temperature sensors. In some embodiments, this interpolation could take into account various thermal qualities of materials between each of the thermal sensors. Such thermal qualities could be, for example, specific heat of the materials, heat dissipation of the materials, etc. The temperature readings and/or thermal gradients can be saved at block 210 in a memory (e.g., memory 110), along with a time the temperature reading was acquired and/or a trigger event associated with the temperature reading. The thermal gradient can also, or alternatively, be output at block 212 for additional analysis (e.g., by the user, as the input to one or more other processes, etc.). For example, the thermal gradient could be overlaid on the visual representation of the DUT to create a heat map for the DUT that can be output for display (e.g., via display 112) to a user. The thermal gradient overlaid on the visual representation of the DUT can also include markers indicating the location of each temperature sensor on the DUT.

The heat map of the DUT can provide an impression of a thermal camera viewing the DUT, even when the DUT is located in an enclosure, an oven, or other obscured location. The thermal gradient may represent the different temperatures by using a variety of colors. This allows a user to readily visualize the temperature ranges on the DUT. In some embodiments, the heat map of the DUT on the display can be updated each time a new scan is performed, periodically as scans are performed, when an event is detected, or any other suitable interval of time. In other embodiments, the thermal gradients may be saved and the heat map of the DUT updated only at the end of the data acquisition. Where multiple thermal gradients are generated, the thermal gradients can be utilized to generate heat maps of the DUT that depict thermal changes of the DUT, or components thereof, over time.

Figure 3:
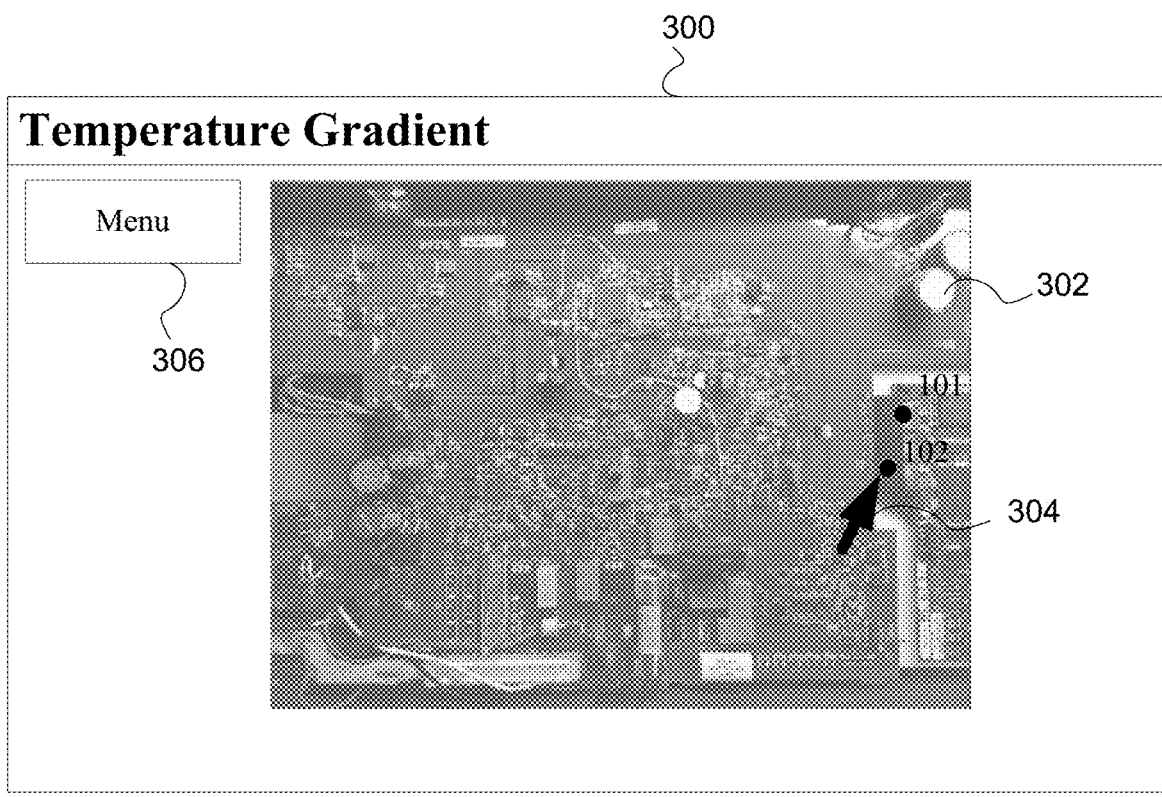
FIG. 3 is an example of a graphical user interface displayed on a display of the test and measurement instrument of FIG. 1 according to some embodiments of the disclosure.

FIG. 3 illustrates an example graphical user interface 300 that can be displayed on the display 112, with an image of the DUT 302 already received and displayed. In FIG. 3, the visual representation of the DUT 302 is an image or photograph of the DUT. However, as mentioned above, many different types of visual representations of the DUT may be used. A user may utilize a user control 104, such as a mouse, touch display, keyboard, etc., to control a cursor 304 displayed on the graphical user interface 300. The user may use the cursor 304 to indicate where each of the temperature sensors are located on the DUT by selecting the location on the image of the DUT and indicating with which port the temperature sensor is connected. For example, in the graphical user interface 300 of FIG. 3, a user has already selected the locations of the temperature sensors associated with ports 101 and 102. One or more menus 306 or controls may be provided for the user on the graphical user interface 300, to either begin the scan or select other control settings. For example, the menu 306 may include an option to toggle off the markers indicating the location of the temperature sensors or may include a location to insert the settings for selecting the different locations of each of the temperature sensors.

Figure 4:
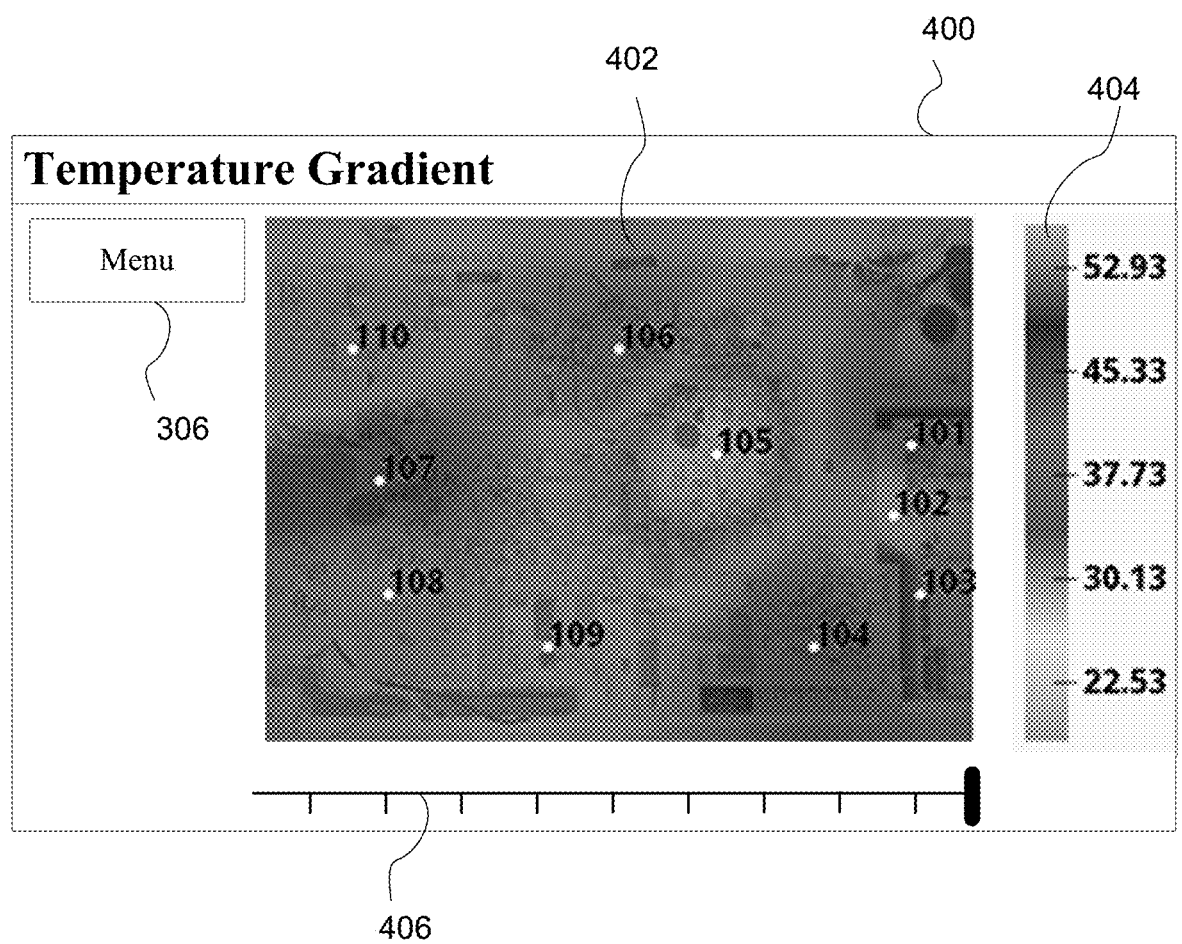
FIG. 4 is another example of a graphical user interface displayed on the display of the test and measurement instrument of FIG. 1 to some embodiments of the disclosure.

FIG. 4 illustrates an example of a graphical user interface 400 displaying a heat map of the DUT. As mentioned above, the thermal gradient 402 may be updated at various intervals. Markers can be overlaid on the heat map indicating the location of each of the temperature sensors on the DUT. For example, in FIG. 4, 10 temperature sensor locations are highlighted on the heat map of the DUT along with an indication of the port number (101-110) to which each temperature sensor is assigned. The graphical user interface 400 may also include a legend 404 showing the temperatures associated with each color/shade shown on the thermal gradient.

The graphical user interface 400 may also include a time slider 406 to allow a user to shift the displayed data backward and forward in time over the entire scanning period. The slider 406 allows a user to see the thermal gradients over time. In some embodiments, the slider 406 may correlate with a selected time, procedure, or trigger that was detected on the DUT. Such a configuration could include an additional portion of the display below the slider 406. As such, a user of the test and measurement system 100 can select various points in time that are of particular interest via slider 406 and can also pan back and forth in time from those points to determine a thermal behavior of the DUT during that test. The temperature data can be persisted in memory and available for further analysis by a general-purpose computer or other tools.

In some embodiments, if the visual representation of the DUT is a CAD drawing, or other design document, the visual representation of the DUT on the display 112 may be a three-dimensional visual representation and a user may indicate the location of the temperature sensors anywhere on the CAD drawing of the DUT. The thermal gradients can then be generated in a three-dimensional space based on the temperature readings of each of the temperature sensors. This could enable a user to view the heat map at different levels within the three-dimensional design of the DUT. For example, consider an instance where a temperature sensor is located on a heatsink of the DUT, not only could the heat map display the temperature of the heatsink, but the thermal characteristics of the heatsink could be utilized to determine the temperature of the component to which the heat sink is attached (e.g., a processor).

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Examples of the disclosure may operate on a particularly created hardware, on firmware, digital signal processors, or on a specially programmed general-purpose computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described regarding a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a data acquisition unit, including a plurality of ports, each port to receive a signal from a respective temperature sensor of a device under test, each temperature sensor associated with a location with respect to the device under test; and a processor configured to: determine a temperature corresponding to each temperature sensor based on the signal received from the respective temperature sensor, generate a thermal gradient for the device under test based on the temperature and the location of each of the temperature sensors, and output the thermal gradient for further analysis.

Example 2 is the data acquisition unit of example 1, wherein the processor is further configured to: determine the temperature for each temperature sensor at a plurality of time intervals over a time period, generate a thermal gradient for each of the plurality of time intervals based on the temperature of each sensor at each time interval and the location associated with each sensor to produce a plurality of thermal gradients for the time period, such that the plurality of thermal gradients represent thermal changes to the device under test over the time period, and output each of the plurality of thermal gradients for further analysis.

Example 3 is the data acquisition unit of Example 2, further comprising a memory, wherein the processor is further configured to store each thermal gradient in the memory with a timestamp corresponding to the respective time interval.

Example 4 is the data acquisition unit of Example 3, wherein the processor is further configured to: receive user input selecting a time interval from the plurality of time intervals select the thermal gradient from the memory corresponding to the selected time interval, and output the selected thermal gradient for further analysis.

Example 5 is the data acquisition unit of one of examples 3 or 4, wherein the processor is further configured to: identify an event associated with the device under test at a time interval of the plurality of time intervals, and store the event in the memory associated with the time interval.

Example 6 is the data acquisition unit of example 5, wherein the data acquisition user further includes user controls, and wherein the user controls are configured to receive user input selecting an event within the time period, and the processor is further configured to select the thermal gradient from the memory having a timestamp that corresponds with a time of the event and output the selected thermal gradient for additional analysis.

Example 7 is the data acquisition unit of any one of Examples 1-6, wherein the processor is further configured to generate the thermal gradient by interpolating a temperature between two or more of the selected portions of the of visual representation of the device under test.

Example 8 is the data acquisition unit of any one of Examples 1-7, wherein to output the thermal gradient for further analysis incudes overlaying the thermal gradient on a visual representation of the device under test to generate a heat map for the device under test, and wherein the visual representation of the device under test includes a picture, a circuit schematic, a block diagram, or a computer-aided design drawing.

Example 9 is a method for generating a thermal gradient for a device under test including: receiving, at each of a plurality of ports of a test and measurement instrument, a signal from a respective temperature sensor, of a plurality of temperature sensors of the device under test, each temperature sensor associated with a location with respect to the device under test; determining, by the test and measurement instrument, a temperature corresponding to each temperature sensor based on the signal received from the respective temperature sensor; generating, by the test and measurement instrument, the thermal gradient for the device under test based on the temperature and the location of each of the temperature sensors, wherein the thermal gradient is indicative of temperatures occurring on the device under test at points between the temperature sensors; and outputting, by the test and measurement instrument, the thermal gradient for further analysis.

Example 10 includes the method of Example 9, further including: determining the temperature for each temperature sensor at a plurality of time intervals over a time period, generating a thermal gradient for each of the plurality of time intervals based on the temperature of each sensor at each time interval and the location associated with each sensor to produce a plurality of thermal gradients for the time period, such that the plurality of thermal gradients represent thermal changes to the device under test over the time period, and outputting each of the plurality of thermal gradients for further analysis.

Example 11 includes method of Example 10, further including: receiving user input selecting a time interval from the plurality of time intervals; selecting the thermal gradient corresponding to the selected time interval; and outputting the selected thermal gradient for further analysis.

Example 12 includes the method of Example 11, further including: identifying an event associated with the device under test at a time interval of the plurality of time intervals, and storing the event and a timestamp associated with the event.

Example 13 includes the method of Example 12, further including receiving user input selecting the event; selecting a thermal gradient from the plurality of thermal gradients having a timestamp that corresponds with the timestamp of the event; and outputting the selected thermal gradient for additional analysis.

Example 14 includes the method of any one of examples 9-13, wherein outputting the thermal gradient for further analysis includes overlaying the thermal gradient on a visual representation of the device under test to generate a heat map of the device under test for display to a user, and wherein the visual representation of the device under test includes a picture, a circuit schematic, a block diagram, or a computer-aided design drawing.

Example 16 is one or more computer readable storage media having instructions stored thereon that, when executed by a processor of a test and measurement instrument, cause the test and measurement instrument to: receive, at each of a plurality of ports of a test and measurement instrument, a signal from a respective temperature sensor, of a plurality of temperature sensors of the device under test, each temperature sensor associated with a location with respect to the device under test; determine, by the test and measurement instrument, a temperature corresponding to each temperature sensor based on the signal received from the respective temperature sensor; generate, by the test and measurement instrument, the thermal gradient for the device under test based on the temperature and the location of each of the temperature sensors, wherein the thermal gradient is indicative of temperatures occurring on the device under test at points between the temperature sensors; and output, by the test and measurement instrument, the thermal gradient for further analysis.

Example 16 is the one or more computer readable storage media of Example 15, further including instructions that, when executed by the processor of the test and measurement instrument, cause the test and measurement instrument to: determine the temperature for each temperature sensor at a plurality of time intervals over a time period, generate a thermal gradient for each of the plurality of time intervals based on the temperature of each sensor at each time interval and the location associated with each sensor to produce a plurality of thermal gradients for the time period, such that the plurality of thermal gradients represent thermal changes to the device under test over the time period, and output each of the plurality of thermal gradients for further analysis.

Example 17 is the one or more computer readable storage media of Example 16, further including instructions that, when executed by the processor of the test and measurement instrument, cause the test and measurement instrument to: receive user input selecting a time interval from the plurality of time intervals; select the thermal gradient corresponding to the selected time interval; and output the selected thermal gradient for further analysis.

Example 18 is the one or more computer readable storage media of Example 17, further including instructions that, when executed by the processor of the test and measurement instrument, cause the test and measurement instrument to: identify an event associated with the device under test at a time interval of the plurality of time intervals, and store the event and a timestamp associated with the event in a memory of the test and measurement instrument.

Example 19 is the one or more computer readable storage media of Example 18, further including instructions that, when executed by the processor of the test and measurement instrument, cause the test and measurement instrument to: receive user input selecting the event; select a thermal gradient from the plurality of thermal gradients having a timestamp that corresponds with the timestamp of the event; and output the selected thermal gradient for additional analysis.

Example 20 is the one or more computer readable storage media of any one of Examples 15-19, wherein to output the thermal gradient for further analysis includes overlaying the thermal gradient on a visual representation of the device under test to generate a heat map of the device under test for display to a user, and wherein the visual representation of the device under test includes a picture, a circuit schematic, a block diagram, or a computer-aided design drawing.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A data acquisition unit, comprising:
a plurality of ports, each port to receive a signal from a respective temperature sensor of a device under test, each temperature sensor associated with a location with respect to the device under test;

a memory;

user controls to receive a user input indicating which ones of the plurality of ports are to be considered during a temperature scanning process and to receive user input indicating a user selection; and a processor configured to:

determine a temperature corresponding to each selected temperature sensor based on the temperature signal received from the respective temperature sensor during a plurality of time intervals during the temperature scanning process, generate a thermal gradient image for each of the plurality of time intervals for the device under test based on the temperature and the location of each of the temperature sensors to generate a collection of thermal gradient images, the collection of thermal gradient images representing thermal changes to the device under test over the time period, store each of the thermal gradient images in the collection in the memory with a timestamp corresponding to the respective time interval, identify an event associated with the device under test at a time interval of the plurality of time intervals, store the event in the memory associated with the time interval, receive user input that the user has selected a particular event, select the thermal gradient image from the memory having a timestamp that corresponds with a time of the selected event, and output the selected thermal gradient image.

2. The data acquisition unit of claim 1, wherein the processor is further configured to:

receive user input selecting a time interval from the plurality of time intervals select the thermal gradient image from the memory corresponding to the selected time interval, and output the selected thermal gradient image.

3. The data acquisition unit of claim 1, wherein the processor is further configured to generate the thermal gradient image by interpolating a temperature between two or more of the selected portions of the of visual representation of the device under test.

4. The data acquisition unit of claim 1, wherein to output the thermal gradient image incudes overlaying the thermal gradient image on a visual representation of the device under test to generate a heat map for the device under test, and wherein the visual representation of the device under test includes a picture, a circuit schematic, a block diagram, or a computer-aided design drawing.

5. The data acquisition unit according to claim 4, in which the visual representation of the device under test is a three-dimensional representation.

6. The data acquisition unit according to claim 1, in which adjacent time intervals in the plurality of time intervals are separated by hours, days, or months.

7. A method for generating a thermal gradient image for a device under test comprising:

receiving, at each of a plurality of ports of a test and measurement instrument, a signal from a respective temperature sensor, of a plurality of temperature sensors of the device under test, each temperature sensor associated with a location with respect to the device under test;

receiving user input that selects which ones of the plurality of ports are to be considered during a temperature scanning process;

determining, by the test and measurement instrument, a temperature corresponding to each selected temperature sensor based on the signal received from the respective temperature sensor during a plurality of time intervals;

generating, by the test and measurement instrument, for each of the plurality of time intervals, the thermal gradient image for the device under test based on the temperature and the location of each of the selected temperature sensors to generate a collection of thermal gradient images, the collection of representing thermal changes to the device under test over the time period, wherein each thermal gradient image in the collection is indicative of temperatures occurring on the device under test at points between the selected temperature sensors;

identifying an event associated with the device under test at a time interval of the plurality of time intervals;

storing the event and a timestamp associated with the event;

receiving user input selecting the event;

selecting a thermal gradient image from the plurality of thermal gradient images having a timestamp that corresponds with the timestamp of the event; and outputting, by the test and measurement instrument, the selected thermal gradient image.

8. The method of claim 7, further comprising:

receiving user input selecting a time interval from the plurality of time intervals; selecting the thermal gradient image corresponding to the selected time interval; and outputting the selected thermal gradient image.

9. The method of claim 7, wherein outputting the thermal gradient image includes overlaying the thermal gradient image on a visual representation of the device under test to generate a heat map of the device under test for display to a user, and wherein the visual representation of the device under test includes a picture, a circuit schematic, a block diagram, or a computer-aided design drawing.

10. The method according to claim 9, wherein the visual representation of the device under test is a three-dimensional representation.

11. The method according to claim 7, in which adjacent time intervals in the plurality of time intervals are separated by hours, days, or months.

12. One or more non-transitory computer readable storage media having instructions stored thereon that, when executed by a processor of a test and measurement instrument, cause the test and measurement instrument to:

receive, at each of a plurality of ports of a test and measurement instrument, a signal from a respective temperature sensor, of a plurality of temperature sensors of the device under test, each temperature sensor associated with a location with respect to the device under test;

receive user input that selects which ones of the plurality of ports are to be considered during a temperature scanning process;

determine, by the test and measurement instrument, a temperature corresponding to each selected temperature sensor based on the signal received from the respective temperature sensor during a plurality of time intervals;

generate, by the test and measurement instrument, for each of the plurality of time intervals, a thermal gradient image for the device under test based on the temperature and the location of each of the selected temperature sensors to generate a collection of thermal gradient images, the collection of representing thermal changes to the device under test over the time period, wherein each thermal gradient image in the collection is indicative of temperatures occurring on the device under test at points between the selected temperature sensors;

identify an event associated with the device under test at a time interval of the plurality of time intervals;

store the event and a timestamp associated with the event;

receive user input selecting the event;

select a thermal gradient image from the plurality of thermal gradient images having a timestamp that corresponds with the timestamp of the event; and output, by the test and measurement instrument, the selected thermal gradient image.

13. The one or more non-transitory computer readable storage media of claim 12, further including instructions that, when executed by the processor of the test and measurement instrument, cause the test and measurement instrument to:

receive user input selecting a time interval from the plurality of time intervals; select the thermal gradient image corresponding to the selected time interval; and output the selected thermal gradient image.

14. The one or more non-transitory computer readable storage media of claim 12, wherein to output the thermal gradient image includes overlaying the thermal gradient image on a visual representation of the device under test to generate a heat map of the device under test for display to a user, and wherein the visual representation of the device under test includes a picture, a circuit schematic, a block diagram, or a computer-aided design drawing.

15. The one or more non-transitory computer readable storage media of claim 14, in which the visual representation of the device under test is a three-dimensional representation.

16. The one or more non-transitory computer readable storage media of claim 12, in which adjacent time intervals in the plurality of time intervals are separated by hours, days, or months.

* * * * *